(12) United States Patent
Yang et al.

(10) Patent No.: US 7,759,674 B2
(45) Date of Patent: Jul. 20, 2010

(54) TRANSISTOR WITH TUNNELING DUST ELECTRODE

(75) Inventors: Yang Yang, Los Angeles, CA (US); Haruo Kawakami, Hino (JP)

(73) Assignees: The Regents of the University of California, Oakland, CA (US); Fuji Electric Holdings Co., Ltd., Kawasaki (JP)

( * ) Notice: Subject to any disclaimer, the term of this patent is extended or adjusted under 35 U.S.C. 154(b) by 579 days.

(21) Appl. No.: 10/592,664

(22) PCT Filed: Sep. 1, 2005

(86) PCT No.: PCT/US2005/031043
§ 371 (c)(1),
(2), (4) Date: Apr. 20, 2007

(87) PCT Pub. No.: WO2006/033794
PCT Pub. Date: Mar. 30, 2006

(65) Prior Publication Data
US 2007/0252130 A1    Nov. 1, 2007

(51) Int. Cl.
*H01L 51/30* (2006.01)
(52) U.S. Cl. .......... 257/40; 257/E51.005; 257/E51.006
(58) Field of Classification Search ............ 257/39, 257/40, 136, E51.004, E51.005, E51.006, 257/E39.016, E39.02, E29.243
See application file for complete search history.

(56) References Cited
U.S. PATENT DOCUMENTS
2003/0213952 A1    11/2003    Iechi et al.
2003/0226996 A1    12/2003    Aramaki et al.

FOREIGN PATENT DOCUMENTS
JP          2003-187983     7/2003
WO         WO-02/37500      5/2002

OTHER PUBLICATIONS

"Complementary circuits with organic transistors", by A. Dodabalapur et al. in Appl. Phys. Lett., vol. 69, pp. 4227-4229 (Dec. 1996).
"A new architecture for polymer transistors", by Y. Yang et al., Nature, vol. 372, pp. 344 (1994).
"Fabrication of Organic Nano-SIT Using Conductive AFM Cantilevers", by Muraishi et al., Technical Report of IEICE, OME2002-15 (May 2002) 13.

*Primary Examiner*—Thomas L Dickey
(74) *Attorney, Agent, or Firm*—Rabin & Berdo, PC

(57) ABSTRACT

A transistor-like electronic device operates somewhat as a triode vacuum tube. Two electrodes (source and drain) sandwich an intermediate layer of organic semiconductor material in which fine metallic particles are dispersed. Due to the fineness and number of the particles, they are close enough to each other that electrons can tunnel from one to the nest, so that a voltage impressed at the edge of the intermediate layer causes current to flow through the dispersed particles, and causes the entire layer to reach the impressed voltage. By varying the impressed voltage, the voltage of the intermediate layer is caused to vary, which controls conduction between the source and drain. By making the particles small, the proportion of open area between the particles remains large so the electrons have room to move around the particles and through the organic material in intermediate layer, allowing high currents to flow through the device.

13 Claims, 3 Drawing Sheets

_US 7,759,674 B2_

TRANSISTOR WITH TUNNELING DUST ELECTRODE

CROSS-REFERENCE TO RELATED APPLICATION

This application claims the domestic priority benefit of applicants' Provisional application Ser. No. 60/612,284, filed Sep. 21, 2004, the disclosure of which is entirely incorporated herein by reference.

FIELD OF THE INVENTION

The invention relates to a thin film transistor made of an organic electronic material. More particularly, the invention relates to a vertical field effect transistor made of an organic electronic material, in which a source electrode layer, a semiconductor layer and a drain electrode layer are sequentially laminated in this order, and the current value between the source electrode and the drain electrode is controlled through electrical signals to a separately provided gate electrode. The invention also relates to a method of manufacturing such a vertical field effect transistor.

BACKGROUND ART

Field effect transistors that use inorganic semiconductor materials are well known, being already manufactured as industrial products. Regarding the basic structure of such a field effect transistor, as shown in FIG. 4, the field effect transistor is arranged in a horizontal direction relative to a substrate 71. A source electrode layer 75 and a drain electrode layer 76 are provided separately from one another by an electrically neutral inorganic semiconductor layer (channel layer region) 74. A gate electrode 72 is disposed on the substrate 71, electrically isolated from the semiconductor layer 74 by a gate-insulating layer 73. The inorganic semiconductor layer 74 is formed of an inorganic material such as an inorganic amorphous material (hydrogenated amorphous Si) or an inorganic polycrystalline material is used as the inorganic semiconductor material constituting.

Moreover, thin film field effect transistors that use organic materials in the semiconductor layer are also well known. Regarding such conventional thin film field effect transistors that use organic materials, again many studies have been carried out into the ones having a basically similar structure to that of the thin film field effect transistor that uses an inorganic material described above, i.e. the ones that are arranged in the horizontal direction relative to the substrate 71. An organic material such as a π electron conjugated macromolecular compound or an aromatic compound has been used as the organic semiconductor material constituting the semiconductor layer 74, as described by A. Dodabalapur et al. in Appl. Phys. Lett., Vol. 69, pp. 4227-29 (December 1996).

With such thin film field effect transistors, an electric field applied from the gate electrode layer acts via the gate insulating layer on the semiconductor layer (channel part), thus controlling the current flowing between the source electrode layer and the drain electrode layer, whereby a transistor effect is realized. Thin film field effect transistors that use an organic material in the semiconductor layer have advantages compared with thin film field effect transistors that use an inorganic material such as Si in the semiconductor layer, namely:

the device can be manufactured without using a vacuum;
a uniform device having a large area can be manufactured;
the manufacturing method is simple, for example a plastic substrate can be used since the device may be manufactured using a low-temperature process.

As a result of these, manufacturing cost can be reduced. However, there have been problems with thin film field effect transistors that use an organic material in the semiconductor layer compared with thin film field effect transistors that use an inorganic material such as Si in the semiconductor layer, for example:

a) the carrier mobility (which indicates the transistor performance) is low;
b) a large current cannot be passed; and
c) high-speed operation is not possible.

As means for resolving these problems, hitherto it has been proposed to adopt a structure in which an organic material layer is disposed between a source electrode and a drain electrode, and the direction of current flow is made to be perpendicular to this organic material layer. For example, Yang et al. have proposed a device that uses a mesh of polyaniline as a gate electrode. More specifically, Yang et al. propose a "conducting network . . . the network is fractal with high surface area [which] functions as a high-performance electrode . . . the contact area for carrier injection into the polymer is increased . . . surface roughness . . . enhances the local electric field." See Y Yang et al., Nature, Vol. 372, pp. 344 (1994). Fractals may be formed on a surface or in space. Frost on a windowpane is an example of a fractal on a surface. An example of a fractal is space is a "sponge," for example, a cubical block measuring three units on a side, with a one-unit cubical void removed from the center of each face, followed by performing the same operation on each of the twenty-one remaining one-unit cubes, and so on infinitely.

Muraishi et al. have formed a gate electrode having nanoscale voids therein by using latex spheres as a vapor deposition mask when depositing the gate electrode, resulting in a gate electrode somewhat resembling Swiss cheese. See Muraishi et al., Technical Report of IEICE, OME2002-15 (2002-05) 13.

In addition, Japanese Patent Application Laid-open No. 2003-110 discloses a method of disposing a gate electrode on side walls of organic films.

In general, the thickness of an organic thin film can be reduced in thickness down to approximately 100 nm, whereas the precision of patterning in a direction parallel to a substrate is of the order of 100 μm. Consequently, if the direction of current flow is made to be perpendicular (vertical) to the organic thin film, then compared with the case that the direction of current flow is parallel (horizontal) to the organic thin film, the cross-sectional area of the current pathway will be larger (approximately 100 nm×100 μm→100 μm×100 μm), and the length of the current pathway will be shorter (approximately 100 μm→100 nm). Hence, the current density can be increased by several orders of magnitude.

However, there has been the following problem with the above. The range of the electric field applied from a gate electrode layer via a gate-insulating layer is generally limited to not more than 1 μm. Specifically, the range of the electric field is represented by the depletion layer thickness d, and is calculated from the following formula.

$$d = (2\epsilon\epsilon_0 V/qN_d)^{1/2}$$

Here, $N_d$ is the charge density, and is represented approximately by the following formula:

$$N_d = \text{Avogadro's number} \times \text{impurity concentration} \times (1/\text{molecular weight}) \times \text{organic semiconductor material density}.$$

For example, taking the permittivity ε of the organic semiconductor material to be 3, the gate voltage V to be 3V, the molecular weight to be 230, the impurity concentration to be 0.01%, and the organic semiconductor material density to be 2 g/cc, gives a charge density $N_d$ of $5.1 \times 10^{23}$ m$^{-3}$, and a depletion layer thickness d of 44 nm. ($N_d$=Avogadro's number×impurity concentration×(1/molecular weight)×organic semiconductor material density=$6 \times 10^{23} \times 0.0001 \times (1/230) \times 2 \times 10^6 = 5.1 \times 10^{23}$ m$^{-3}$).

To control the current flowing between the source electrode layer and the drain electrode layer and thus realize transistor operation, it is necessary to make the spacing between the respective parts of the gate electrode less than this electric field range (i.e. less than 1 μm), but it is industrially difficult to form a gate electrode with such spacing. For example, if the gate resembles Swiss cheese then the hole diameter should be around $10^{22}$ m$^{-3}$.

Moreover, if the proportion of the area of the device occupied by the gate electrode is high, then the area available for the current pathways will be limited. This will be disadvantageous in terms of the performance of the device.

SUMMARY OF THE INVENTION

To better understand the limitations of the electrodes discussed above, an analogy to a triode vacuum tube is useful. A triode tube has an anode and a cathode with and a gate electrode in between them. The gate controls the amount of current flowing between the other two electrodes and through the gate, which is usually a metal mesh or grid. Depending on the voltage impressed upon it by the circuitry, the grid creates an electrostatic potential at the place where it is located but it also lets electrons pass through the holes in the mesh.

The maximum useful current flows when the grid is at the same potential as the cathode, but at this voltage the grid screens the cathode and the electron current from the cathode to the anode is not as great as it would be if the grid were absent. To allow the maximum current through the grid its openings should be large. However, if openings holes are too large the electrostatic field will not reach the middle of the holes undiminished, and current control will not respond properly to the voltage on the grid. Also, the area of the gate electrode should be minimized in order to allow the maximum current to flow between the source and drain.

If the grid of a triode tube could be made of charged dust instead of charged wires, then the efficiency of the grid would be increased because the projected area of the grid would be reduced, while still maintaining electric field uniformity. Of course, this is not possible in a vacuum tube, because there is nothing that could support the dust in place. Supposing that a dust could somehow be supported, there would remain the problem of charging the dust suspended in a high vacuum, because vacuum is insulating. However, if the dust particles were close enough to one another, then electrons could pass from one dust particle to the next by quantum-mechanical "tunneling."

If such particles were very small then they could be close enough to permit tunneling while still maintaining a high proportion of open area between them, to allow current to pass around them. This can be understood by considering a paper with polka-dots. If the image is shrunk, then the proportion of white space stays the same, but the distance between the dots decreases.

In a triode there is a high vacuum, but if any gas inside the gas can become conductive, then electrons on the grid can move off of it into the surrounding space, and the tube may malfunction.

The present invention is concerned with semiconductor devices. In view of the problems of the prior art described above, it is an object of the invention to provide a 3-terminal transistor device using an organic semiconductor material, wherein the transistor device has a device structure giving excellent performance and high productivity.

A transistor device of the invention is a transistor device in which an organic material layer is disposed between a first electrode and a second electrode, wherein a fine metal particle dispersion layer is disposed within the organic material layer, and charge is injected into the fine metal particle dispersion layer through a tunnel current from a third electrode separate from the first electrode and the second electrode, whereby a current flowing between the first electrode and the second electrode is controlled.

According to the transistor device of the invention, the gate electrode is formed from a fine metal particle dispersion layer, and hence potential control for each of the fine metal particles is achieved through a tunnel current. Thus, wiring to each individual fine metal particle is not required. Fine patterning therefore is not required when forming the gate electrode. Hence, the productivity of the device is improved.

Moreover, preferably, the fine metal particle dispersion layer comprises parts having a high fine metal particle concentration and parts having a low fine metal particle concentration, with the parts having a high fine metal particle concentration being in contact with the third electrode. As a result, because the parts having a high fine metal particle concentration have low electrical resistance, even in the case that the distance from the third electrode is large, a current can be supplied via the parts having a high fine metal particle concentration.

Moreover, the fine metal particle dispersion layer is preferably formed through simultaneous vacuum deposition (codeposition) of an organic material and a metal. As a result, the dispersion of the fine metal particles into the organic material can be carried out easily and over a large area.

Moreover, surfaces of the fine metal particles are preferably coated with an oxide film of the metal. As a result, the metal oxide film on the surfaces of the fine metal particles acts as a coating gate insulating layer, and hence it becomes possible for an applied electric field to control the current flowing between the source electrode layer and the drain electrode layer. If the dust particles are surrounded by semiconductor material, any charge on the dust particles can leak away through this semiconductor material. If they are insulated, then conduction from particle to particle by tunneling is not inhibited, but leakage through the surrounding medium is inhibited.

Moreover, it is particularly preferable for the fine metal particles to be made of aluminum or magnesium. Aluminum or magnesium can be suitably used because processes such as vacuum deposition are easy with aluminum or magnesium, and moreover an oxide film is readily produced on the surface of aluminum or magnesium, making application to the device of the invention easy.

According to the invention, there can be provided a 3-terminal transistor device using an organic semiconductor material, wherein the transistor device has a device structure giving excellent performance and high productivity.

BRIEF DESCRIPTION OF THE DRAWINGS

FIGS. 1A and 1B are schematic drawings showing the constitution of an embodiment of a transistor device of the invention, wherein FIG. 1B is a sectional view along line A-A' in FIG. 1A.

FIGS. 2A and 2B are schematic drawings showing the constitution of an embodiment of a transistor device of the invention, wherein FIG. 2B is a sectional view along line A-A' in FIG. 2A.

FIGS. 3A and 3B are schematic drawings showing the constitution of a conventional vertical transistor device, wherein FIG. 3B is a sectional view along line A-A' in FIG. 3A.

DETAILED DESCRIPTION OF THE PREFERRED EMBODIMENTS

Figure 1A:
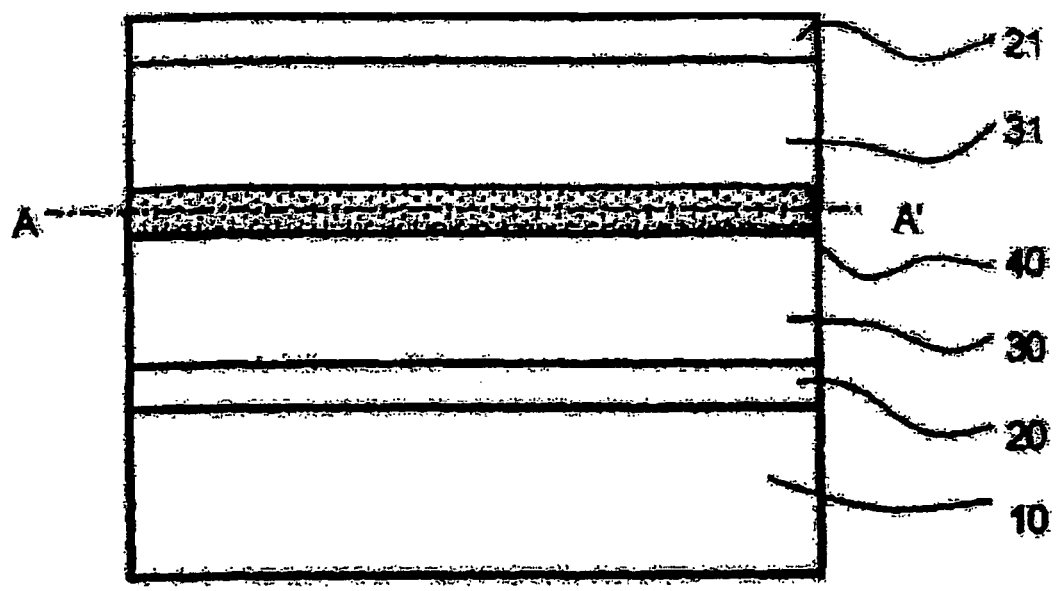
Figure 1B:
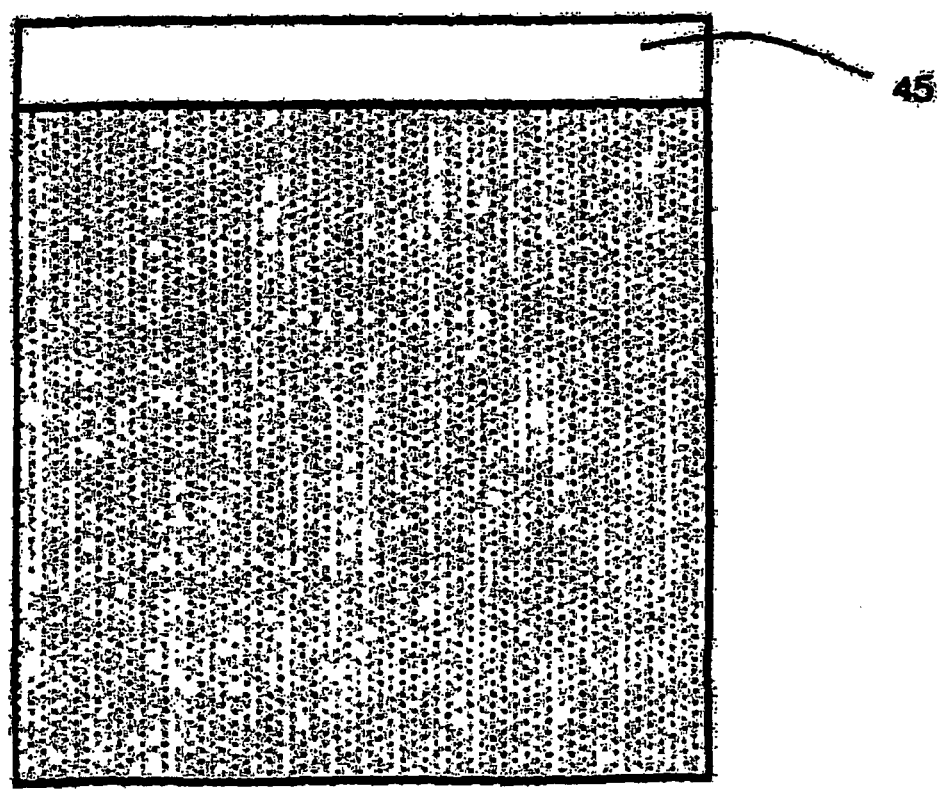

Following is a detailed description of the invention with reference to the drawings. FIGS. 1A and 1B are schematic drawings showing the constitution of an embodiment of a 3-terminal transistor device of the invention. As shown in FIGS. 1A and 1B, in this transistor device, a first electrode layer 20, an organic semiconductor material layer 30, a fine metal particle dispersion layer 40, an organic semiconductor material layer 31, and a second electrode layer 21 are formed as thin films sequentially on a substrate 10. A current is injected from a third electrode 45 into the fine metal particle dispersion layer 40 through a tunnel current.

Figure 2A:
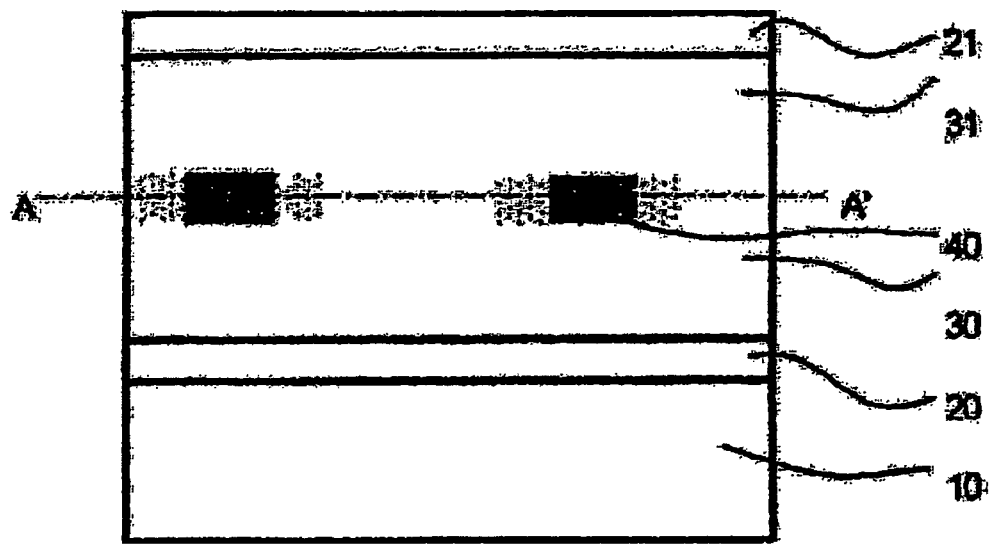
Figure 2B:
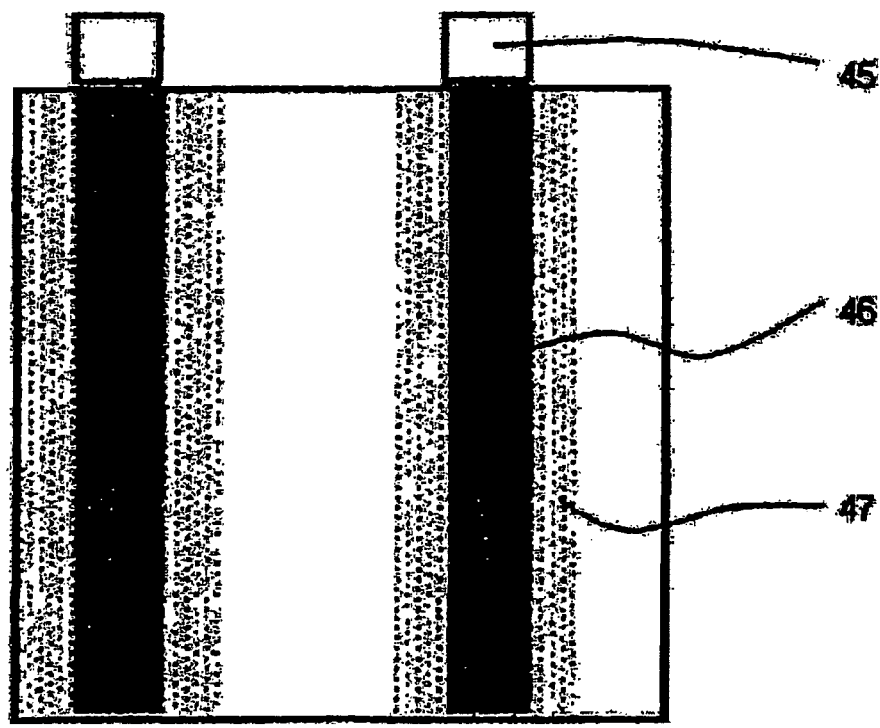

Moreover, FIGS. 2A and 2B are schematic drawings showing the constitution of another embodiment of the 3-terminal transistor device of the invention. In FIGS. 2A and 2B, the fine metal particle dispersion layer 40 is formed in stripes. That is, the fine metal particle dispersion layer 40 can be constituted such that parts having a high fine metal particle concentration 46 are formed in stripes, and parts having a low fine metal particle concentration 47 exist therebetween and/or therearound. According to this construction, the electrical resistance is lower at the parts having a high fine metal particle concentration, and hence even in the case that the distance from the third electrode 45 is high, current can be supplied via the parts having a high fine metal particle concentration. Moreover, the parts having a low fine metal particle concentration 47 act effectively as pathways for the current flowing between the first electrode and the second electrode. In the case, for example that the fine metal particle dispersion layer is formed by vacuum deposition, this constitution can be formed using masked vapor deposition in stages, or can also be obtained by making the distance between the mask and the substrate large or increasing the vacuum pressure so that there is much spreading of the deposited material, and utilizing the resulting blurring of the shape of the fine metal particle dispersion layer. Note that in FIGS. 2A and 2B the fine metal particle concentration is for simplicity shown as having two levels, but the effects will also be the same in the case that the fine metal particle concentration has a continuous distribution.

Figure 3A:
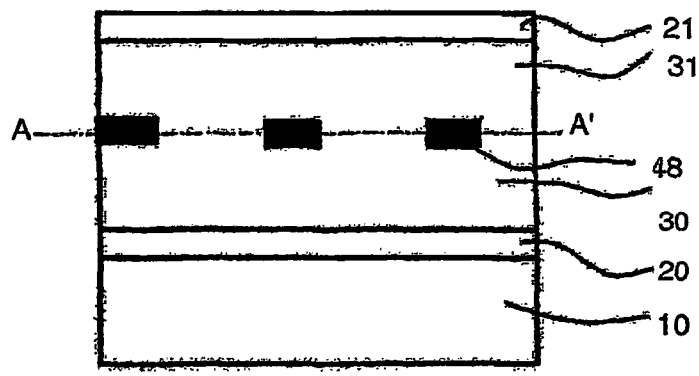
Figure 3B:
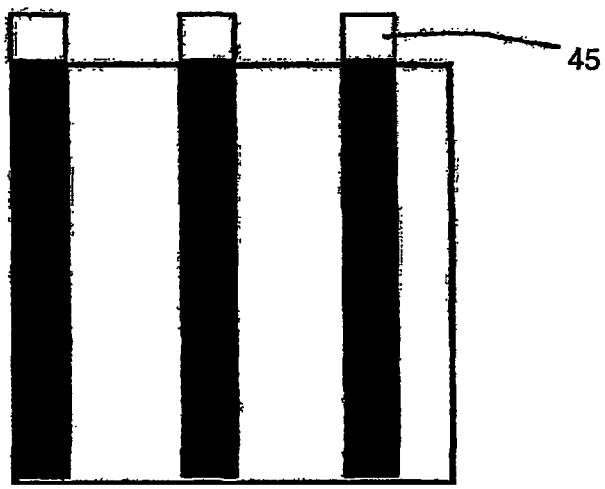
Figure 4:
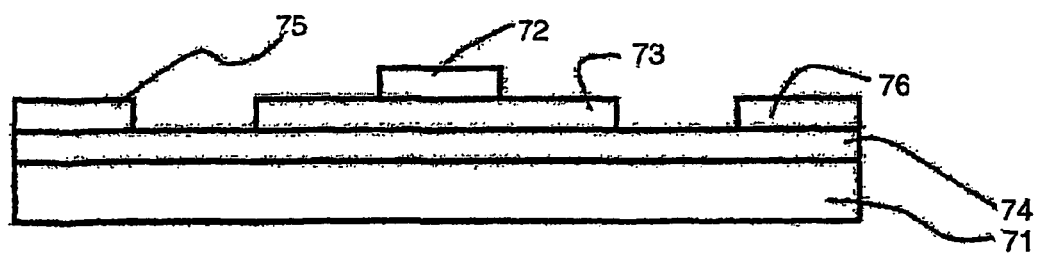
FIG. 4 is a schematic drawing showing the constitution of a conventional horizontal-type transistor device.

Comparing the device of the invention with a conventional vertical transistor as shown in FIGS. 3A and 3B, with a conventional gate electrode made of a metal only, the conventional gate electrode part will not act as a pathway for the current flowing between the first electrode and the second electrode (the source-drain current), and hence the effective cross-sectional area for the current is limited. However, with the device of the invention, the gate electrode is constituted from a fine metal particle dispersion layer, and hence the source-drain current can flow through the gaps between the fine metal particles. Thus, the effective cross-sectional area for the current can be increased.

Moreover, with the device of the invention, because the source-drain current passes close to the fine metal particles, the controllability is improved. Alternatively, even if a striped electrode shape is adopted with parts of organic material layer only being provided within the fine metal particle dispersion layer as in FIGS. 2A and 2B, the parts having a low fine metal particle concentration 47 will function as both parts of the gate electrode and pathways for the source-drain current, and hence the spacing between the parts of the gate electrode can be made wider than conventionally. Thus, it becomes possible not only to make the formation of the electrode simple, but also to make the source-drain current effectively larger.

There are no particular limitations on the substrate 10, though it is being preferable to use a conventional glass substrate or the like. Moreover, there are no particular limitations on the first electrode layer 20 and the second electrode layer 21, with it being possible to select a metallic material such as aluminum, gold, silver, nickel or iron, an inorganic material such as ITO or carbon, an organic material such as a conjugated organic material or a liquid crystal, a semiconductor material such as silicon, or the like as appropriate.

Regarding these materials, it is known that the injection of charge into the organic semiconductor material of the organic semiconductor material layer 30 or 31 greatly depends on the work function of the metal electrode. Here, the work function of the first or second electrode layer means the minimum energy required to remove an electron from the surface of the material in question, and is a value characteristic of the electrode material. The work function can be measured from the photoelectron emission spectrum in atmospheric air. Examples of electrode materials having a low absolute value of the work function include aluminum, lithium, magnesium and calcium, with these being suitable for injecting electrons into the organic material.

In the other electrode, the work function should be high for easily ejecting holes from the electrode material (i.e., easily absorbing electrons). Moreover, examples of materials having a high absolute value of the work function include gold, chromium, platinum and ITO. These are suitable for injecting holes into the organic material.

There are no particular limitations on the method of forming the first electrode layer 20 and the second electrode layer 21, with it being preferable to use a conventional publicly-known thin film formation method, for example a vacuum deposition method, or an application method such as spin coating. In the case of forming each of the thin films by vacuum deposition, the substrate temperature during the deposition is selected as appropriate in accordance with the electrode material used, but is preferably in a range of 0° C. to 150° C. Moreover, the thickness of each of the electrode layers is preferably in a range of 50 to 200 nm.

Next, examples of preferable organic semiconductor materials used in each of the organic semiconductor material layers 30 and 31 include: acene molecular materials selected from among naphthalene, anthracene, tetracene, pentacene, hexacene, and derivatives thereof; pigments selected from among phthalocyanine type compounds, azo type compounds, and perylene type compounds, and derivatives thereof; low molecular weight compounds selected from among aminoimidazole type compounds, dicyano type compounds, pyridone type compounds, styryl type compounds, stilbene type compounds, quinomethane type compounds, butadiene type compounds, hydrazone compounds, triphenylmethane compounds, diphenylmethane compounds, aryl vinyl compounds, pyrazoline compounds, triphenylamine compounds, phenylene derivatives, and triarylamine compounds, and derivatives thereof; macromolecular compounds selected from among poly-N-vinylcarbazole, halogenated poly-N-vinylcarbazoles, polyvinylpyrene, polyvinylanthracene, polythiophene derivatives, thiophene oligomer derivatives, pyrene formaldehyde resins, polyacetylene derivatives, and ethylcarbazole formaldehyde resins; and fluorenone type, diphenoquinone type, benzoquinone type, anthraquinone type, and indenone type compounds. However, there is no limitation to these examples.

Next, a description will be given of the fine metal particle dispersion layer 40. A characteristic feature of the invention is that a fine metal particle dispersion layer 40 that includes fine metal particles and an organic semiconductor material is disposed between the organic semiconductor material layer 30 and the organic semiconductor material layer 31. Any of various metallic materials can be used for the fine metal particles. For example aluminum, magnesium, gold, silver, copper, platinum, calcium, lithium, rhodium or the like can be selected as appropriate, with there being no particular limitations. However, to promote the field effect on the organic semiconductor material layers, it is effective to form an insulating film such as an oxide film on the surface of the metal. Therefore, it is preferable to use aluminum or magnesium, for which such an oxide film is readily formed. Moreover, as the organic semiconductor material used in the fine metal particle dispersion layer 40, the same material as in the organic semiconductor material layers 30 and 31 can be used. For example, aminoimidazole type compounds, dicyano type compounds, and quinomethane type compounds have high affinity to, or readily form a compound with aluminum, whereby a high-resistance film easily can be formed on the surfaces of the fine metal particles. Therefore, these materials all are suitable as the organic semiconductor material used in the fine metal particle dispersion layer 40.

As the method of forming the fine metal particle dispersion layer 40, it is preferable to codeposit the fine metal particles and the organic semiconductor material using vacuum deposition or the like. As a result, because the metal is vaporized, fine metal particles of size 5 to 20 nm can be obtained. Moreover, a uniform hybrid thin film between the fine metal particles and the organic semiconductor material can be obtained through such codeposition.

The codeposition can be carried out using a conventional vapor deposition apparatus under conditions similar to those in depositing the organic semiconductor material layers 30 and 31. The substrate temperature is selected as appropriate in accordance with the organic material used, with 0 to 150° C. being preferable. Moreover, regarding the degree of vacuum, the codeposition is preferably carried out at a pressure of $10^{-5}$ torr or less. Furthermore, the volume ratio between the fine metal particles and the organic semiconductor material in the codeposition is preferably in a range of 10:1 to 1:20. Moreover, the thickness of the fine metal particle dispersion layer 40 is preferably in a range of 3 to 200 nm. With a fine metal particle dispersion layer formed in this way, the fine metal particles will not be in contact with one another, but upon applying a voltage, a current will flow by a tunnel effect, and the electric potential of the fine metal particles can be controlled.

Moreover, the work function of the fine metal particles generally will be within the energy gap of the organic semiconductor material. Thus, once charge has been injected into the fine metal particles, this charge will not be prone to migration into the organic semiconductor material. Therefore, in many cases a field effect will act through the so-called Schottky effect. Nevertheless, to make the field effect from the fine metal particles reliable, it is desirable for the fine metal particles and the organic semiconductor material to be electrically insulated from one another by a metal oxide film coating or the like. In the case of forming the fine metal particles by vacuum deposition using aluminum or magnesium, an oxide film of thickness approximately a few nm easily can be formed on the surfaces of the fine metal particles by an oxidizing gas such as oxygen or water contained in the vacuum as residual gas.

Moreover, the fine metal particle dispersion layer 40 may also be formed using a method of application such as spin coating under conditions similar to those under which the organic semiconductor material layers 30 and 31 are formed. In this case, as the application solvent, particularly in the case of using a metal such as platinum or rhodium as the fine metal particles, it is preferable to use a solvent in which this material easily can be dispersed, for example an alcohol such as ethyl alcohol, methyl alcohol or propyl alcohol, a glycol such as ethylene glycol, THF, ethylene glycol dimethyl ether, or pure water.

The organic semiconductor material is dissolved in an amount in a range of 0.001 to 30 mass %, and the fine metal particles are dispersed in an amount in a range of 0.001 to 30 mass %, in the application solvent. Moreover, a binder resin may be added as required, thus producing an application liquid. As the binder resin, for example a polycarbonate, a polyester, polyvinyl alcohol, polystyrene or the like can be used. The spin coating conditions can be set as appropriate in accordance with the target film thickness, but the rotational speed is preferably in a range of 200 to 3600 rpm. Moreover, the thickness of the fine metal particle dispersion layer 40 is preferably in a range of 3 to 200 nm. Such fine metal particles having a size of nanometer order are, for example, readily procurable as generally marketed products from companies such as Tanaka Kikinzoku Co.

Following is a more detailed description of the transistor device of the invention provided by way of examples. Four examples, one comparative example and one test example are described.

EXAMPLE 1

A transistor device having a constitution as shown in FIGS. 1A and 1B was manufactured by the following procedure. Using a glass substrate as a substrate 10, a first electrode layer 20, an organic semiconductor material layer 30, a fine metal particle dispersion layer 40, an organic semiconductor material layer 31, and a second electrode layer 21 were formed sequentially as thin films to thicknesses of 100 nm, 40 nm, 20 nm, 40 nm and 100 nm respectively using a vacuum deposition method, thus forming a transistor device of Example 1.

Regarding the evaporation source for the each layer, gold was used for the first electrode layer 20 and the second electrode layer 21, and copper phthalocyanine (made by Aldrich) was used for the organic semiconductor material layers 30 and 31. Moreover, the fine metal particle dispersion layer 40 was formed by codepositing aluminum and copper phthalocyanine in a volume ratio of 3:1.

The deposition was carried out using a resistive heating method, and under a vacuum of $3 \times 10^{-6}$ torr, with the vapor deposition apparatus being exhausted using a diffusion pump. The residual gas when forming the fine metal particle dispersion layer in particular was 70% water.

EXAMPLE 2

Deposition was carried out under the same conditions as in Example 1, except that the fine metal particle dispersion layer 40 was formed in stripes with a pitch of 300 μm as shown in FIGS. 2A and 2B, thus obtaining a transistor device of Example 2. A vapor deposition mask was used in the formation of the stripes of the fine metal particle dispersion layer 40, with the mask width being 50 μm. The spacing between the substrate and the mask was made to be 1.0 mm.

EXAMPLE 3

Deposition was carried out under the same conditions as in Example 2, except that the fine metal particle dispersion layer was obtained by depositing aluminum and copper phthalocyanine under conditions of a volume ratio of 1:3 and a film thickness of 10 nm with a mask width of 200 μm, and then depositing aluminum and copper phthalocyanine under conditions of a volume ratio of 3:1 and a film thickness of 10 nm with a mask width of 50 μm, with the spacing between the substrate and the mask being 0.3 mm, thus obtaining a transistor device of Example 3.

EXAMPLE 4

Deposition was carried out under the same conditions as in Example 2, except that pentacene (made by Aldrich) was used for the organic semiconductor material layers 30 and 31, thus obtaining a transistor device of Example 4.

Comparative Example

Following the device constitution shown in FIGS. 3A and 3B, a fine metal particle dispersion layer 40 was not used, but rather a gate electrode 48 made of a metal only was formed in stripes with a pitch of 300 μm. A vapor deposition mask was used in the formation of the stripes of the metal gate layer 48, with the spacing between the substrate and the mask being 0.3 mm. Other than this, the deposition was carried out under the same conditions as in Example 2, thus obtaining a transistor device of the Comparative Example.

Test Example

The electrical resistance of the fine metal particle dispersion layer alone was measured in a direction parallel to the substrate for each of Examples 1, 2, 3 and 4. The electrical resistance under conditions of a current pathway cross section of 35 mm×20 nm and a current pathway length of 30 mm was in a range of approximately 4 to 8 kΩ for all of Examples 1, 2, 3 and 4. It was thus confirmed that electrical conduction had been secured even though the fine metal particles were not in contact with one another.

Moreover, with the fine metal particle dispersion layer in each of Examples 2 and 4, the mask width was 50 μm, but spreading of the fine metal particles was seen over approximately 100 μm on each side. In other words, by making the distance between the vapor deposition mask and the substrate large, parts having a low fine metal particle concentration of width 100 μm could be formed on each side of each part having a high fine metal particle concentration of width 50 μm, and hence at least 250 μm out of the 300 μm electrode pitch could be covered with the fine metal particle dispersion layer. It can also be envisaged that at a level that could not be observable by eyes there may have been covering at a higher ratio. In contrast with this, with Example 3 and Comparative Example 1, such spreading was hardly seen, with the amount thereof being only approximately 10 μm.

For the transistor device of each of Examples 1 to 4 and Comparative Example 1, a voltage of 3V was applied between the first electrode and the second electrode, and the change in the source-drain current upon changing the voltage of the gate electrode 45 from 0V to 2V was measured. The results are shown in Table 1. The measurements were carried out at room temperature.

TABLE 1

| | Source-drain current (pA) | | |
|---|---|---|---|
| | Gate voltage 0 V | Gate voltage 2 V | On/off ratio |
| Example 1 | 28 | 0.2 | 1.4E+02 |
| Example 2 | 53 | 0.04 | 1.3E+03 |
| Example 3 | 64 | 1.1 | 5.8E+01 |
| Example 4 | 80 | 0.07 | 1.1E+03 |
| Comparative Example 1 | 60 | 54 | 1.1E+00 |

From the results in Table 1, it can be seen that for Examples 1, 2, 3 and 4, a change in the source-drain current was observed upon changing the gate voltage, and a large value was obtained for the on/off ratio. For the Comparative Example, on the other hand, the change in the source-drain current was low, and hence the effects of the invention are clear.

What is claimed is:

1. A transistor device, comprising
a first electrode, a second electrode and a third electrode;
an organic material layer disposed between the first and second electrodes; and
a fine metal particle dispersion layer disposed within the organic material layer, wherein charge is injected into the fine metal particle dispersion layer by a tunnel current from the third electrode separate from the first electrode and the second electrode, whereby to control a current flowing between the first electrode and the second electrode,
wherein the fine metal particle dispersion layer comprises parts having a high fine metal particle concentration and parts having a low fine metal particle concentration, wherein the parts having a high fine metal particle concentration are in contact with the third electrode.

2. The transistor device according to claim 1, wherein the surfaces of the fine metal particles are coated with an oxide film of the metal.

3. A transistor device, comprising
a first electrode, a second electrode and a third electrode;
an organic material layer disposed between the first and second electrodes; and
a fine metal particle dispersion layer, formed through codeposition of an organic material and a metal, disposed within the organic material layer, wherein charge is injected into the fine metal particle dispersion layer by a tunnel current from the third electrode separate from the first electrode and the second electrode, whereby to control a current flowing between the first electrode and the second electrode, and
the fine metal particle dispersion layer comprises parts having a high fine metal particle concentration and parts having a low fine metal particle concentration, wherein the parts having a high fine metal particle concentration are in contact with the third electrode.

4. The transistor device of claim 3, wherein surfaces of the fine metal particles are coated with an oxide film of the metal.

5. The transistor device according to claim 3, wherein the fine metal particles are made of aluminum or magnesium.

6. An electrode gate comprising a sheet of organic material including a fine metal particle dispersion disposed within the organic material;

wherein the spacing of the fine metal particles is such that a voltage impressed onto at least one edge of the sheet causes electron tunneling between adjacent particles of the fine metal particle dispersion, whereby the electrode gate reaches the impressed voltage by current flow through the sheet, the current flow including electron tunneling, and the fine metal particle dispersion comprises parts having a higher fine metal particle concentration and parts having a lower fine metal particle concentration, wherein the parts having a higher fine metal particle concentration include the edge where the voltage is impressed.

7. The gate of claim 6, wherein surfaces of the fine metal particles are coated with an oxide film of the metal.

8. The gate according to claim 6, wherein the fine metal particles comprise aluminum or magnesium.

9. The gate according to claim 6, wherein the work function of the fine metal particles is generally within the energy gap of the organic material.

10. The gate according to claim 6, wherein the fine metal particles are confined to a central portion of the sheet in a direction of the thickness of the sheet.

11. The gate according to claim 6, wherein the organic material is an organic semiconductor material.

12. The gate according to claim 6, comprising a solid-metal striped electrode.

13. A method of forming the gate according to claim 6, comprising codepositing the fine metal particles and the organic material.

* * * * *